United States Patent
Yieh et al.

(10) Patent No.: US 10,943,779 B2
(45) Date of Patent: Mar. 9, 2021

(54) METHOD AND SYSTEM FOR THREE-DIMENSIONAL (3D) STRUCTURE FILL

(71) Applicant: APPLIED MATERIALS, INC., Santa Clara, CA (US)

(72) Inventors: Ellie Yieh, San Jose, CA (US); Ludovic Godet, Boston, MA (US); Srinivas Nemani, Sunnyvale, CA (US); Er-Xuan Ping, Fremont, CA (US); Gary Dickerson, Gloucester, CA (US)

(73) Assignee: Applied Materials, Inc., Santa Clara, CA (US)

( * ) Notice: Subject to any disclaimer, the term of this patent is extended or adjusted under 35 U.S.C. 154(b) by 450 days.

(21) Appl. No.: 15/356,475

(22) Filed: Nov. 18, 2016

(65) Prior Publication Data

US 2017/0069488 A1    Mar. 9, 2017

Related U.S. Application Data

(62) Division of application No. 14/044,138, filed on Oct. 2, 2013, now Pat. No. 9,530,674.

(51) Int. Cl.
*H01L 21/00* (2006.01)
*H01L 21/02* (2006.01)
(Continued)

(52) U.S. Cl.
CPC ...... *H01L 21/02271* (2013.01); *C23C 14/021* (2013.01); *C23C 14/046* (2013.01);
(Continued)

(58) Field of Classification Search
CPC ......... H01L 21/02271; H01L 21/28556; C23C 14/021; H01J 2237/334
See application file for complete search history.

(56) References Cited

U.S. PATENT DOCUMENTS

| | | | |
|---|---|---|---|
| 5,915,195 A | 6/1999 | Fulford, Jr. et al. | |
| 6,255,162 B1 * | 7/2001 | Tsai | H01L 21/02164 257/E21.248 |

(Continued)

FOREIGN PATENT DOCUMENTS

| | | | | |
|---|---|---|---|---|
| KR | 10-2005-0000871 | | 1/2005 | |
| WO | WO-2015050707 A1 * | | 4/2015 | ....... H01L 21/02266 |

OTHER PUBLICATIONS

International Preliminary Report on Patentability from PCT/US2014/056095 dated Apr. 14, 2016, 6 pgs.

(Continued)

*Primary Examiner* — Laura M Menz
(74) *Attorney, Agent, or Firm* — Schwabe, Williamson & Wyatt, P.C.

(57) ABSTRACT

Embodiments include methods and systems of 3D structure fill. In one embodiment, a method of filling a trench in a wafer includes performing directional plasma treatment with an ion beam at an angle with respect to a sidewall of the trench to form a treated portion of the sidewall and an untreated bottom of the trench. A material is deposited in the trench. The deposition rate of the material on the treated portion of the sidewall is different than a second deposition rate on the untreated bottom of the trench. In one embodiment, a method includes depositing a material on the wafer, filling a bottom of the trench and forming a layer on a sidewall of the trench and a top surface adjacent to the trench. The method includes etching the layer with an ion beam at an angle with respect to the sidewall.

6 Claims, 10 Drawing Sheets

(51) Int. Cl.
*H01L 21/67* (2006.01)
*C23C 14/02* (2006.01)
*C23C 14/04* (2006.01)
*C23C 16/02* (2006.01)
*C23C 16/04* (2006.01)
*C23C 16/455* (2006.01)
*C23C 16/50* (2006.01)
*H01J 37/32* (2006.01)
*H01L 21/285* (2006.01)
*H01L 21/311* (2006.01)
*H01L 21/3213* (2006.01)

(52) U.S. Cl.
CPC ........ *C23C 16/0227* (2013.01); *C23C 16/045* (2013.01); *C23C 16/45544* (2013.01); *C23C 16/50* (2013.01); *H01J 37/32009* (2013.01); *H01L 21/0228* (2013.01); *H01L 21/02266* (2013.01); *H01L 21/02274* (2013.01); *H01L 21/02315* (2013.01); *H01L 21/2855* (2013.01); *H01L 21/28556* (2013.01); *H01L 21/31116* (2013.01); *H01L 21/32136* (2013.01); *H01L 21/67017* (2013.01); *H01L 21/67213* (2013.01); *H01J 2237/334* (2013.01)

(56) References Cited

U.S. PATENT DOCUMENTS

| | | | | |
|---|---|---|---|---|
| 6,750,116 B1 * | 6/2004 | Chen | ............... | H01L 21/76237 257/E21.551 |
| 7,067,440 B1 | 6/2006 | Bayman et al. | | |
| 7,176,039 B1 | 2/2007 | Papasouliotis et al. | | |
| 7,355,221 B2 * | 4/2008 | Freeman | ........... | H01L 21/26506 257/213 |
| 7,612,351 B2 | 11/2009 | Kim | | |
| 8,093,634 B2 * | 1/2012 | Mowry | ............ | H01L 29/66772 257/288 |
| 8,101,510 B2 | 1/2012 | Godet et al. | | |
| 8,278,183 B2 * | 10/2012 | Lerner | ................. | H01L 21/743 438/427 |
| 8,367,544 B2 * | 2/2013 | Cheng | .............. | H01L 21/76825 438/672 |
| 8,372,489 B2 | 2/2013 | Hautala | | |
| 9,530,674 B2 * | 12/2016 | Yieh | ..................... | C23C 16/50 |
| 2006/0024910 A1 | 2/2006 | Chatterjee et al. | | |
| 2006/0040485 A1 * | 2/2006 | Lee | .................. | H01L 21/76877 438/597 |
| 2006/0255415 A1 * | 11/2006 | Freeman | ............ | H01L 29/7843 257/408 |
| 2007/0072388 A1 | 3/2007 | Chen et al. | | |
| 2007/0289867 A1 | 12/2007 | Cohen | | |
| 2009/0294860 A1 * | 12/2009 | Mowry | .......... | H01L 21/823814 257/368 |
| 2010/0193898 A1 | 8/2010 | Hautala et al. | | |
| 2015/0093907 A1 * | 4/2015 | Yieh | ................ | H01L 21/02266 438/758 |
| 2015/0136732 A1 * | 5/2015 | Tang | .................... | C23C 14/046 216/37 |
| 2016/0293445 A1 * | 10/2016 | Han | .................. | H01L 21/76816 |
| 2017/0069488 A1 * | 3/2017 | Yieh | ................... | C23C 16/0227 |
| 2017/0330796 A1 * | 11/2017 | Ruffell | ................. | C23C 16/402 |

OTHER PUBLICATIONS

Non-Final Office Action for U.S. Appl. No. 14/044,138 dated Nov. 17, 2015, 11 pgs.

Final Office Action for U.S. Appl. No. 14/044,138 dated May 4, 2016, 9 pgs.

"International Search Report and Written Opinion of the International Searching Authority dated Dec. 30, 2014, in International Patent Application No. PCT/US2014/056095, 9 pages".

* cited by examiner

METHOD AND SYSTEM FOR THREE-DIMENSIONAL (3D) STRUCTURE FILL

CROSS-REFERENCE TO RELATED APPLICATIONS

This application is a divisional of U.S. patent application Ser. No. 14/044,138, filed on Oct. 2, 2013, the entire contents of which are hereby incorporated by reference herein.

BACKGROUND

1) Field

Embodiments of the present invention pertain to the field of semiconductor processing and, in particular, to methods of three-dimensional (3D) structure fill.

2) Description of Related Art

Semiconductor wafer processing may involve forming and filling trenches in semiconductor wafers or substrates. Filling trenches in a semiconductor wafer or substrate with a material may be referred to as "gap fill." Gap fill is used in a variety of applications, such as in the formation of through-silicon vias (TSVs). As trench widths become narrower and trench aspect ratios increase, the process of filling trenches becomes more challenging.

One existing gap fill method is spin-coating. Spin-coating typically involves coating a wafer or substrate with a liquid material with a spin-coating machine. Spin-coating machines may include a spin track that holds and rotates the wafer or substrate, and a nozzle at the center of the spin track that dispenses the liquid material. The spin-coating machine rotates the wafer or substrate, and thus distributes the material throughout the wafer surface and into the trenches. In spin-coating methods, a solvent is used to control the viscosity of the liquid material dispensed, which introduces impurities into the filled trenches. Impurities in the filled trenches can reduce performance and yield of devices formed with the filled trenches. Furthermore, spin-coating involves post-processing steps after depositing the liquid material, such as curing the deposited material.

Another existing gap fill method involves deposition of the fill material via chemical vapor deposition (CVD), atomic layer deposition (ALD), plasma-enhanced chemical vapor deposition (PECVD), or physical vapor deposition (PVD). CVD, ALD, PECVD, and PVD methods of filling trenches typically result in deposition of more material on the upper sidewalls of the trenches than on the bottom and lower sidewalls of the trenches. Such methods also result in more deposited material on the top surfaces adjacent to the trenches. FIG. 1 illustrates a cross-sectional view of a semiconductor wafer 100 with trenches 101 that have been filled via such a deposition process. The deposition process deposits more of the material 103 on the upper portions of the trench sidewalls 104 and top surfaces 108 than at the bottoms 102 of the trenches 101. The uneven deposition forms overhangs, which can cause the trench openings to close prior to completely filling the gap, resulting in voids 106.

Gap fill defects such as unwanted voids can result in poor device performance, defective devices, and high variability die-to-die or wafer-to-wafer.

SUMMARY

One or more embodiments of the invention are directed to methods of three-dimensional (3D) structure fill.

In one embodiment, a method of filling a trench in a semiconductor wafer involves performing directional plasma treatment with an ion beam at an angle with respect to a sidewall of the trench to form a treated portion of the sidewall and an untreated bottom of the trench. The method also includes depositing a material in the trench. A deposition rate of the material on the treated portion of the sidewall is different than a second deposition rate on the untreated bottom of the trench.

In one embodiment, a system to fill a trench in a semiconductor wafer includes a plasma chamber to generate an ion beam at an angle with respect to a sidewall of the trench to form a treated portion of the sidewall and an untreated bottom of the trench. The system also includes a deposition chamber to deposit a material in the trench, wherein a deposition rate of the material on the treated portion of the sidewall is different than a second deposition rate on the untreated bottom of the trench.

In one embodiment, a method of filling a trench in a semiconductor wafer involves depositing a material on the semiconductor wafer, filling a bottom of the trench and forming a layer on a sidewall of the trench and a top surface adjacent to the trench. The method also involves etching the layer on the sidewall of the trench and the top surface with an ion beam at an angle with respect to the sidewall.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Apparatuses, systems, and methods of three-dimensional structure fill are described. Three-dimensional structure fill can include filling trenches in a semiconductor wafer or substrate with a material, also known as gap fill. The term "trench" is used in the following description to refer to any hole or other three-dimensional structure capable of being filled in a semiconductor wafer or substrate.

Embodiments of the invention involve the use of one or more angled ion beams to treat portions of trench sidewalls to change the deposition rate of fill materials on the treated portions. A treated "portion" of a sidewall may include the entire sidewall, or less than the entire sidewall. The angled ion beams can treat part or all of the trench sidewalls without treating the trench bottom. The deposition rate of fill materials on the treated portions can be lower than the untreated bottoms, resulting in bottom-up fill without the formation of overhangs at the trench opening, or voids caused by such overhangs. Other embodiments involve treating portions of the sidewalls to increase the deposition rate of fill materials on the sidewalls with respect to the untreated trench bottom. An increased deposition rate on the trench sidewalls can result in the formation of a layer on the trench sidewalls known as a spacer.

In one embodiment of the invention, a method of gap fill involves one or more cycles of a multi-step process including material deposition, and etching with one or more angled ion beams. The angled ion beams permit etching of overhangs to keep the trench opening clear, without significantly etching the trench bottom. One such embodiment enables bottom-up gap fill without void formation.

In the following description, numerous specific details are set forth, such as specific systems for generating angled ion beams, in order to provide a thorough understanding of embodiments of the present invention. It will be apparent to one skilled in the art that embodiments of the present invention may be practiced without these specific details. In other instances, well-known aspects, such as deposition chemistries for forming layers on a semiconductor wafer or substrate, are not described in detail in order to not unnecessarily obscure embodiments of the present invention. Furthermore, it is to be understood that the various embodiments shown in the Figures are illustrative representations and are not necessarily drawn to scale.

Figure 2:
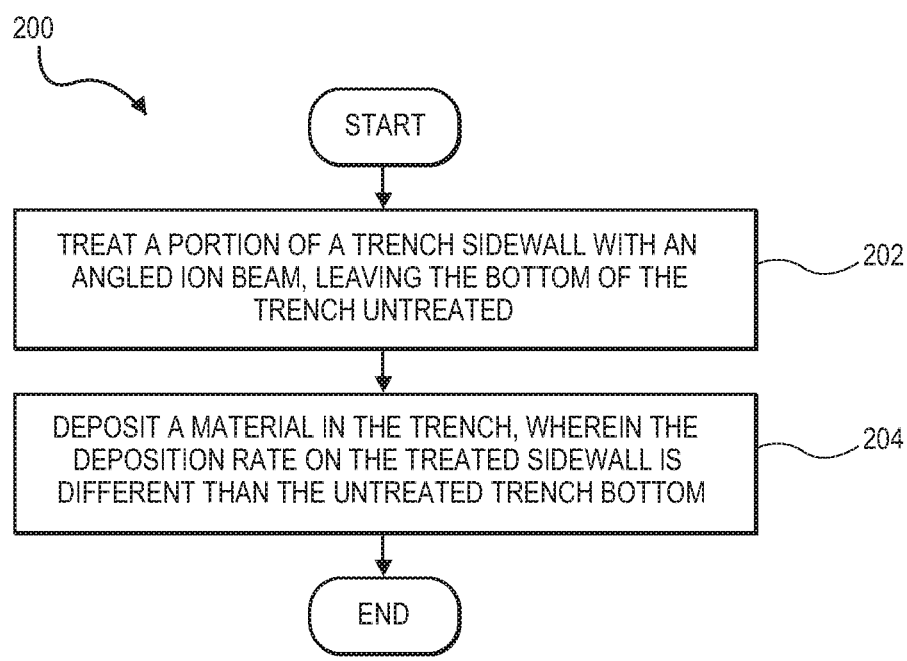
FIG. 2 is a flowchart representing operations in a method of filling a trench in a semiconductor wafer, in accordance with an embodiment of the present invention.

FIG. 2 is a flowchart representing operations in a method of filling a trench in a semiconductor wafer, in accordance with an embodiment of the present invention. FIGS. 3A, 3B, 3C, and 3D illustrate cross-sectional views of a semiconductor wafer including a trench during performance of a method of filling the trench, corresponding to operations in the method 200 of FIG. 2, in accordance with embodiments of the present invention.

Figure 3A:
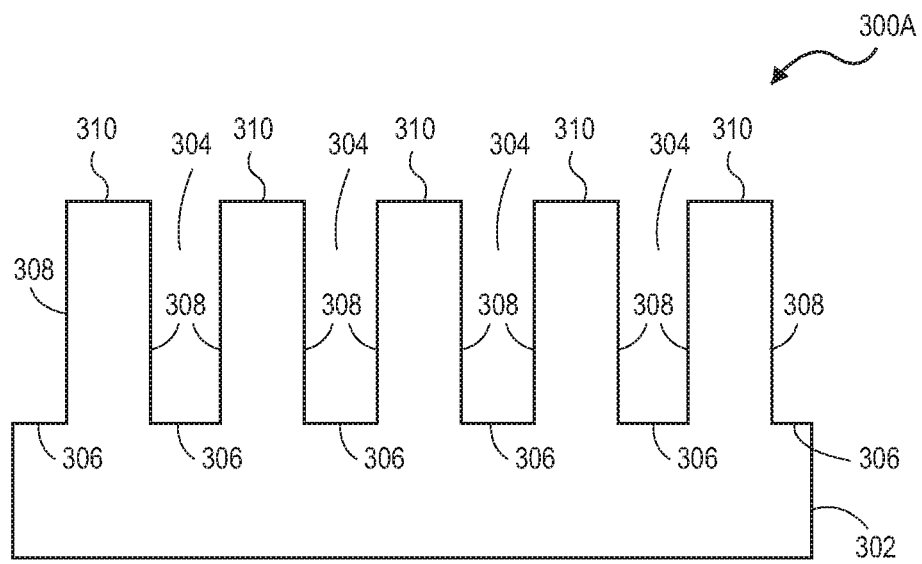
FIGS. 3A, 3B, 3C, and 3D illustrate cross-sectional views of a semiconductor wafer including a trench during performance of a gap fill method corresponding to operations in the flowchart of FIG. 2, in accordance with embodiments of the present invention.

The method 200 in FIG. 2 starts with a semiconductor wafer or substrate including trenches, such as in FIG. 3A. FIG. 3A illustrates a cross-sectional view 300A of the semiconductor wafer 302 with trenches 304. The trenches 304 have bottoms 306 and sidewalls 308. The trenches 304 may be formed by, for example, plasma etching the semiconductor wafer 302, or by any other means of forming trenches. The trenches 304 illustrated in FIG. 3A have a vertical profile, however, the semiconductor wafer 302 can include trenches with tapered or other profiles, or other 3D structures capable of being filled. Top surfaces 310 of the semiconductor wafer 302 are adjacent to the trenches 304.

Figure 3B:
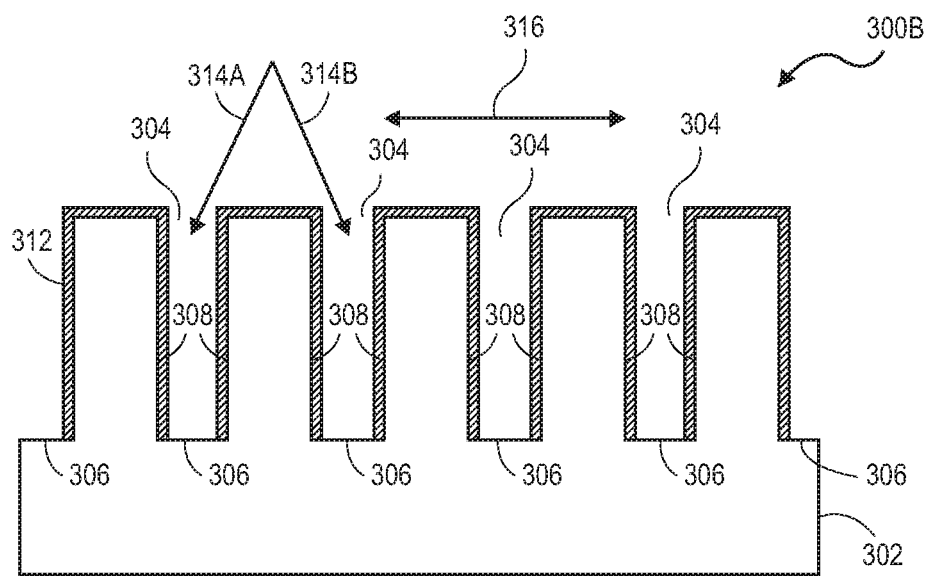
Figure 8:
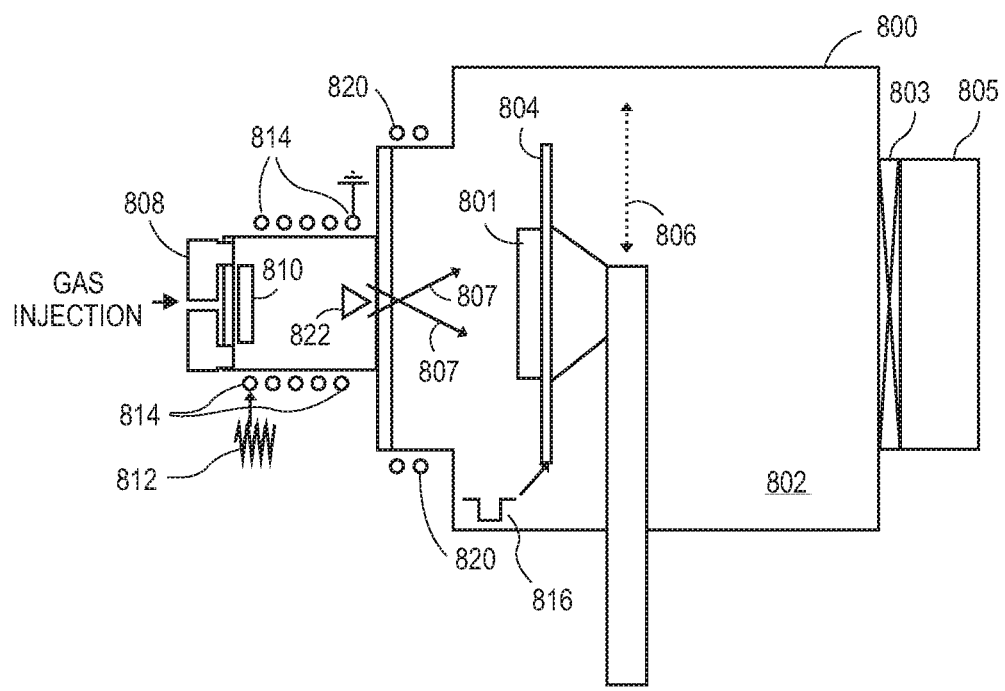
FIG. 8 illustrates an exemplary directional plasma treatment system to generate angled ion beams used in methods of gap fill, in accordance with an embodiment of the present invention.

Operation 202 of the method 200 corresponds to FIG. 3B, and involves treating a portion of the trench sidewalls 308 and top surfaces 310 with an angled ion beam 314A. Thus, at operation 202, an ion beam generation apparatus generates an angled ion beam 314A to strike a portion of the trench sidewalls 308, and the top surfaces 310 of the semiconductor wafer 302 to form treated surfaces 312. FIG. 8 illustrates one example of an ion beam generation apparatus (the directional plasma treatment system 800) to generate angled ion beams, and is discussed in greater detail below. In the embodiment illustrated in FIG. 3B, the ion beam generation apparatus generates two angled ion beams 314A and 314B to simultaneously bombard two sidewall portions with ions. Other embodiments may include a single angled ion beam, or more than two angled ion beams.

The ion beams 314A and 314B treat the bombarded surfaces. According to embodiments, directional plasma treatment involves ion assisted plasma processing to change the properties of the treated regions to affect the deposition rate on the surface of the treated regions. Ion assisted plasma processing can include, for example, ion implantation, ion assisted deposition, or ion mixing. Treated regions can result in higher or lower rates of deposition as compared to untreated regions, as is explained in more detail below. Treatments to change the deposition rate on the treated surfaces 312 can involve, for example, increasing the dopant concentration, changing the dopant or impurity profile of the treated regions, changing the hydrophobicity of the surface, poisoning the surface using impurities, or damaging the treated surface. In an embodiment involving changing the dopant or impurity profile, the treatment can cause the treated regions to have a surface peak, retrograde, or box-like dopant profile, in exemplary embodiments. In one embodiment, the ion beam treatment uses a low energy mono-mere of molecular ion. The ion species can be, for example, $Si^+$, $O^+$, $N^+$, $As^+$, $B^+$, $P^+$, $H^+$, $Al^+$, $C^+$, $F^+$, or any other molecular ions appropriate for a given application. FIG. 3B illustrates the treated layer 312 that is deposited on the sidewall surfaces, increasing the sidewall thickness. However, in other embodiments, directional plasma treatment changes the surface properties of the sidewalls without increasing the thickness of the sidewalls.

Figures 9A, 9B:
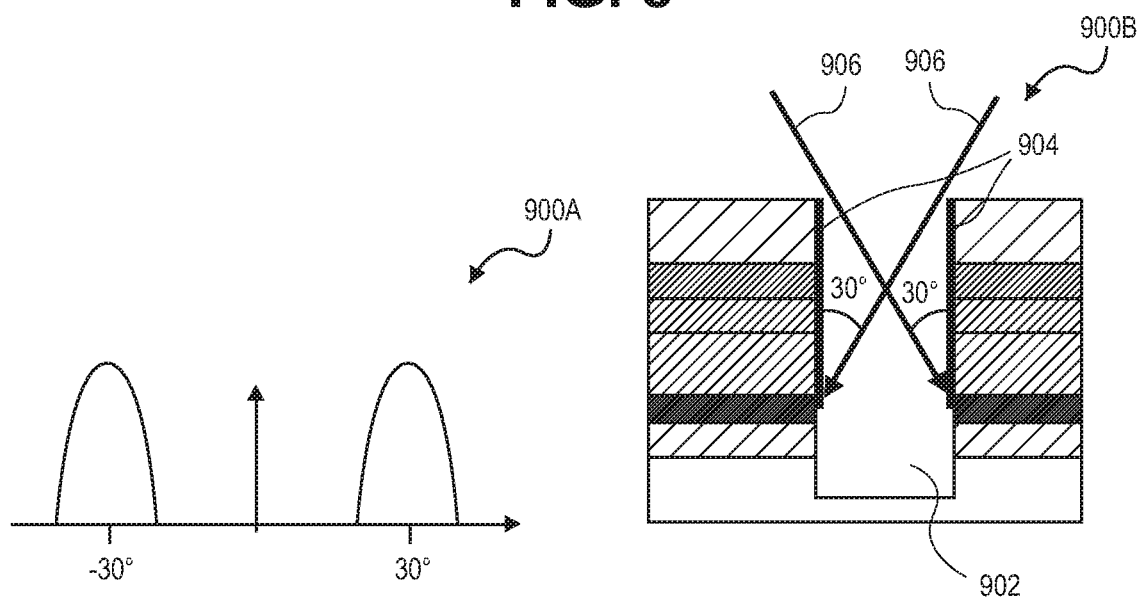
FIG. 9A illustrates a graph of exemplary ion angular distributions for ion beams used in methods of gap fill, in accordance with an embodiment of the present invention.
FIG. 9B illustrates a cross-sectional view of a trench being struck by angled ion beams with angular distributions as in the graph of FIG. 9A, in accordance with an embodiment of the present invention.

Unlike in traditional plasma processes, the ion beams 314A and 314B are at an angle (i.e., a non-zero angle) with respect to the trench sidewalls 308. The ion beams can include an angular distribution of ions. The center of the angular distribution is the "center angle." Thus, the angle of the ion beams is defined by the center angle of the angular distribution. FIG. 9A is a graph 900A illustrating one example of an ion angular distribution. The graph 900A shows a bi-directional ion angular distribution for two ion beams 906, as illustrated in FIG. 9B. The ion beams 906 have center angles of −30 degrees and 30 degrees as illustrated in the graph 900B, and therefore are at 30 degree angles with respect to the trench sidewalls 904. The angled ion beams 906 strike the trench sidewalls 904, but not the trench bottom 902. Returning to FIG. 3B, like the ion beams 906 of FIG. 9B, the ion beams 314A and 314B are at non-zero angles with respect to the sidewalls 308. For example, in one embodiment, the ion beams 314A and 314B are at an angle in the range of 1-85 degrees with respect to the sidewalls 308. Thus, the angled ion beams 314A and 314B can treat some or all portions of the sidewalls 308 without treating the trench bottoms 306.

In one embodiment, angles of the ion beams 314A and 314B are determined according to one or more factors such as, for example, the aspect ratio of the trenches 304, the chemical composition of the filling material, the ion species, and other process parameters influencing the deposition rate of the filling material. The ion beam generation apparatus may generate ion beams at smaller angles with respect to the sidewalls 308 for narrow, deep trenches, and larger angles for wide, shallow trenches. According to an embodiment, the maximum ion beam angle is chosen to treat some or all portions of the sidewalls 308, but to not treat the trench bottoms 306. Although FIG. 3B illustrates the entire sidewalls 308 treated, the treated portions 312 of the sidewalls may include only a percentage of the upper sidewalls. Such embodiments may treat the upper sidewalls of the trench, while leaving the bottom sidewalls untreated. As indicated above, the ion beam angles and the percentage of the trench sidewalls to treat may depend on the width of the trench opening and the trench aspect ratio. For example, for treating sidewalls of a trench having an aspect ratio of approximately 5 to 1, the ion beam generation apparatus may generate ion beams at an angle to treat a top 20-30% of the sidewall, according to one embodiment. In another example, for treating sidewalls of a trench having an aspect ratio of approximately 4 to 1, the ion beam generation apparatus may generate ion beams at an angle to treat at least a top 80% of the sidewall.

The ion beam generation apparatus can generate ion beams at different angles to achieve different effects for different trenches, or even for each sidewall in a trench. For example, in one embodiment, the ion beam generation apparatus treats the sidewalls of one trench with ion beams at a first angle, and then treats the sidewalls of another trench with ion beams at a second angle. Such treatment may be used for semiconductor wafers having trenches of different aspect ratios and/or widths, for example. In another embodiment, the ion beam generation apparatus generates one ion beam at a first angle to treat a first sidewall, and a second ion beam at a second angle to treat another sidewall of the same trench. Such treatment may be used for trenches having one face that is more robust to treatment than another.

As indicated above, the ion beam generation apparatus may generate one angled ion beam, or multiple angled ion beams. Generating multiple ion beams simultaneously enables more than one sidewall portion to be treated at the same time, reducing the processing time. However, in one embodiment, a single angled ion beam may be preferred. For example, in some circumstances, treating a single portion of the sidewall 308 may be sufficient to prevent unwanted voids in the trench. In embodiments, treatment of further sidewalls beyond what is necessary to prevent void formation may be undesirable because treating the surface involves introducing impurities or damaging the surface of the sidewall. In one embodiment where one face of a trench sidewall is near a feature that is susceptible to damage from the sidewall treatment, the ion beam generation apparatus can treat one or more other faces of the sidewall that are more robust to treatment.

In some applications, it may be desirable to treat all the faces of a trench. For example, for a cylindrical trench, an ion beam generation apparatus can treat upper surface portions around the entire circumference of the trench. In one such embodiment, the ion beam generation apparatus includes a rotating stage over which the semiconductor wafer 302 is supported. After treating one or two faces of the sidewalls 308, the stage can rotate the semiconductor wafer 302 to treat other faces of the sidewalls 308. The process of treating sidewall faces and rotating the semiconductor wafer 302 can continue until all the sidewall faces are treated. The ion beam generation apparatus may also include a scanning system to treat the sidewalls in multiple trenches across the semiconductor wafer 302. A scanning system includes a mechanism to move the semiconductor wafer 302 or ion beam sources relative to each other to treat neighboring trenches, as illustrated by the arrow 316.

Figure 3C:
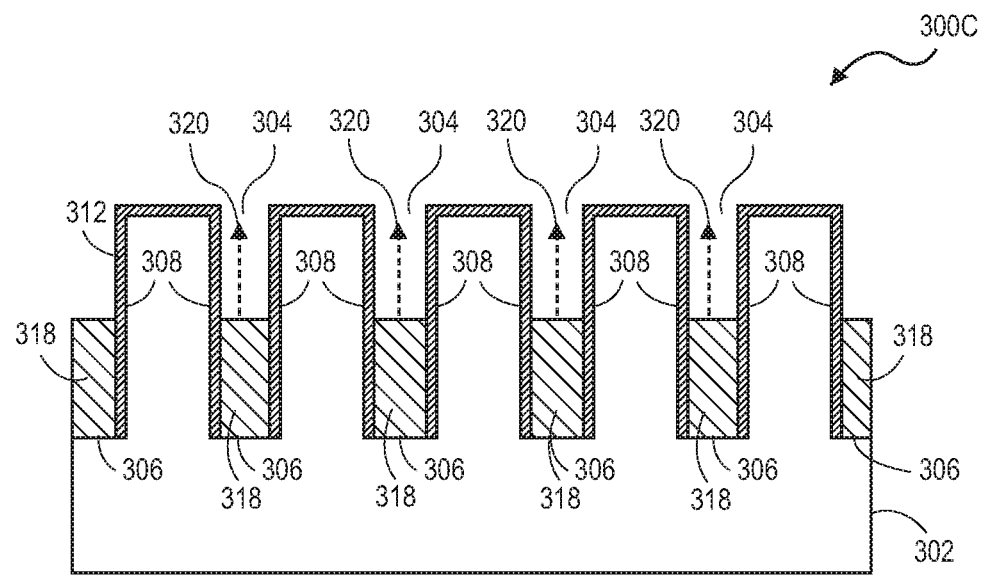

After treating portions of the sidewalls 308 at operation 202, a deposition system deposits a material on the semiconductor wafer 302, at operation 204, and as illustrated in the cross-sectional view 300C of FIG. 3C. The deposition can include material deposition by CVD, ALD, PVD, PECVD, or other similar method of deposition. The deposited material can include dielectrics, metals (e.g., cobalt, aluminum, or other metals), or any other material used in gap fill. The material is deposited in the trenches 304 at a different rate on the treated surfaces 312 than on the untreated trench bottoms 306. FIG. 3C illustrates an example where the deposition rate is slower on the treated surfaces 312. Thus, the material 318 is deposited at a faster rate at the untreated trench bottoms 306, and at a slower rate on the treated sides and treated top surfaces. The different rates of deposition enable bottom-up fill (as indicated by the arrows 320) of narrow trenches with high aspect ratios without creating unwanted voids.

Figure 1:
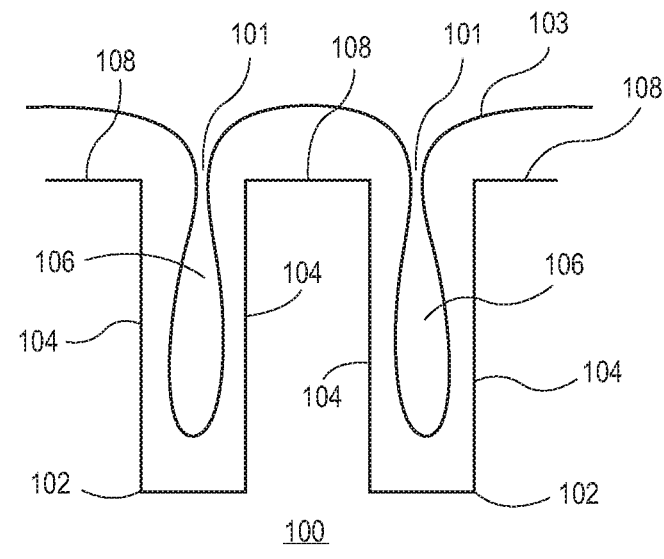
FIG. 1 illustrates a cross-sectional view of a semiconductor wafer with a trench that has been filled via a deposition process resulting in an unfilled void in the trench.

One example of a bottom-up fill method as described above involves treating silicon upper sidewalls with nitrogen to form a treated SiN portion of the upper sidewall. The deposition rate of materials, such as in the deposition of an oxide from a tetraethyl orthosilicate (TEOS)/ozone process, is higher on the untreated trench bottoms than on the treated upper sidewalls. Therefore, the subsequent deposition process does not result in the typical overhang edge features as illustrated in FIG. 1, and the trench can be filled from the bottom-up without forming a void.

Figure 3D:
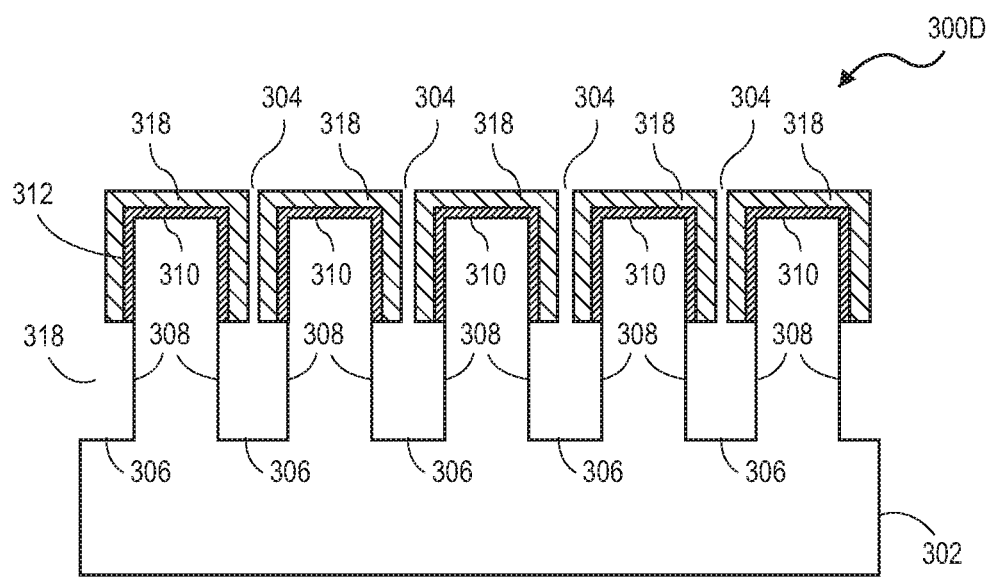

In another embodiment, and as illustrated in FIG. 3D, the sidewalls 308 are treated to speed up the deposition rate on the upper sidewalls to form a layer on the upper trench sidewalls known as a spacer.

As illustrated in the cross-sectional view 300D of FIG. 3D, an ion beam generation apparatus treats the top surfaces 310 and upper portions of the trench sidewalls 308 to form treated portions 312. A deposition system then deposits a material in the trenches 304. In the illustrated embodiment, the treatment results in a higher rate of deposition on the treated portions than on the untreated bottom and untreated lower sidewalls. Thus, the deposited material 318 is thicker on the treated upper sidewalls and on the top surfaces 310. The deposited material 318 acts as a spacer, which can provide isolation between the underlying layer and materials deposited in the trench 304, according to one embodiment. For example, the directional plasma treatment can form a spacer dielectric at the top of the trenches 304, which can enable improved isolation in the locations of the spacers between polycrystalline silicon deposited in the trenches 304 and active areas in the underlying silicon substrate.

Although FIG. 3D illustrates spacers on both sidewalls 308 of the trenches 304, other embodiments can form a spacer on only one of the sidewalls 308 of the trenches 304. Additionally, FIG. 3D illustrates spacers having equal thicknesses and extending to equal depths in the trenches 304. In other embodiments, the spacers can have different thicknesses and/or extend to different depths in the trenches 304. In one such embodiment, the ion beam generation apparatus generates ion beams having different angles with respect to the sidewalls 308 to treat different percentages of the upper sidewalls. For example, the ion beam generation apparatus can generate one ion beam at an angle to treat the top 20% of one sidewall of a trench, and another ion beam to treat the top 30% of the opposing sidewall of the trench. In other embodiments, as explained above, a single ion beam can treat one side of the trench 304, which can result in the formation of spacers on one sidewall of the trenches 304. To form spacers with different thicknesses, the ion beam generation apparatus can generate one ion beam using one chemistry to treat one sidewall of a trench, and generate another ion beam using a different chemistry to treat the opposing sidewall of the trench.

Thus, the method 200 of FIG. 2 illustrates a method of gap fill that includes modifying the material properties of portions of the trench sidewalls with angled ion beam treatment. The modified material properties can result in slower or faster rates of deposition on the treated portions, enabling finer control over the gap fill process. The method can enable bottom-up gap fill without voids, or can enable the controlled generation of spacers.

Figure 4:
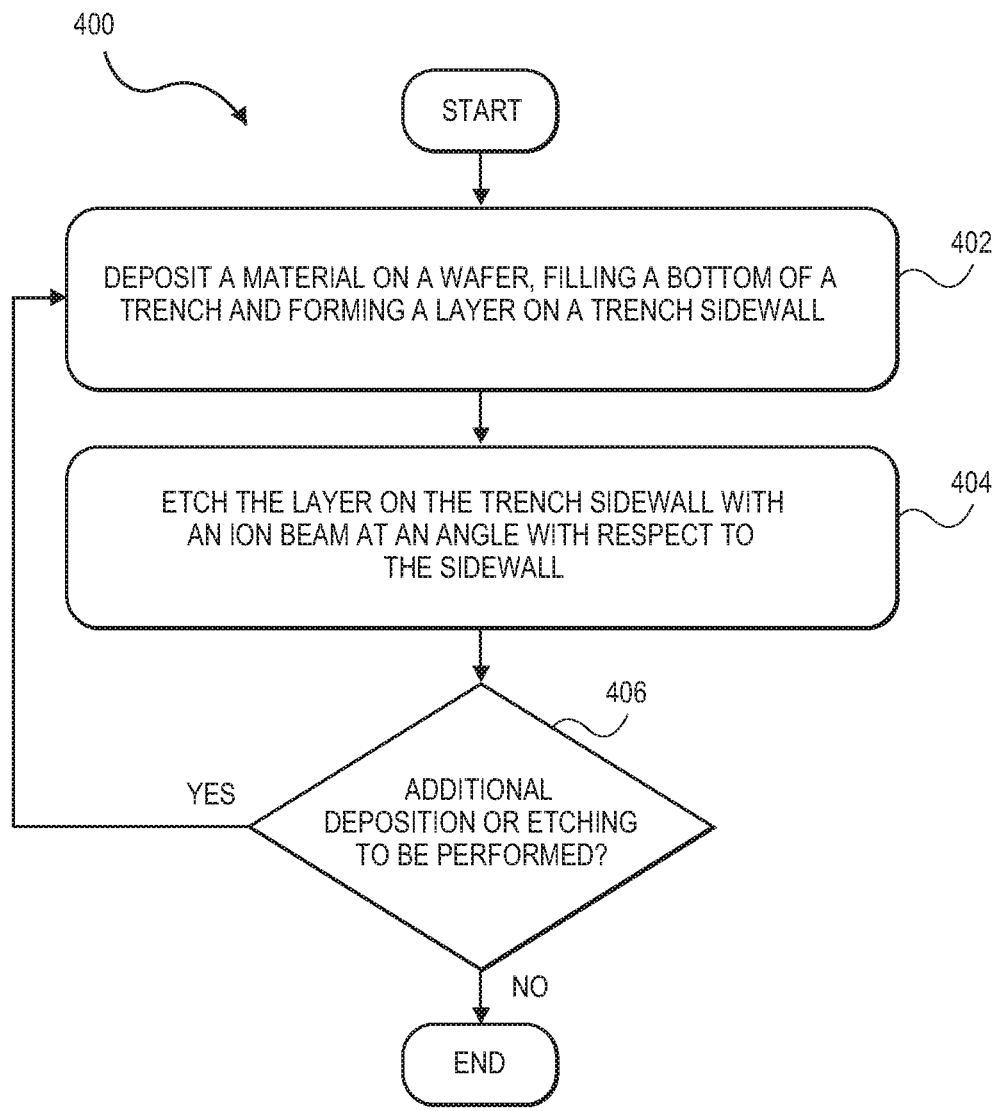
FIG. 4 is a flowchart representing operations in a gap fill method of filling a trench in a semiconductor wafer, in accordance with an embodiment of the present invention.

FIG. 4 is a flowchart representing operations in another method of filling a trench in a semiconductor wafer, in accordance with an embodiment of the present invention. FIGS. 5A, 5B, 5C, 5D, 5E, and 5F illustrate cross-sectional views of a semiconductor wafer including a trench during performance of a method of filling the trench, corresponding to operations in the flowchart of FIG. 4, in accordance with embodiments of the present invention. Like the method 200 of FIG. 2, the method 400 of FIG. 4 starts with a semiconductor wafer 302 with trenches 304, as illustrated in the cross-sectional view 500A of FIG. 5A. The method 400 can involve multiple iterations of material deposition and etching with an angled ion beam. At operation 402, and corresponding to FIG. 5B, a deposition chamber deposits a material on the semiconductor wafer 302, filling the bottoms 306 of the trenches 304, and forming a layer 502 on the trench sidewalls and the top surfaces 310. The deposition process can result in more material deposited on the top surfaces 310 and the upper sidewalls of the trenches 304, as illustrated in the cross-sectional view 500B of FIG. 5B. The greater deposition of material on the upper sidewalls results in overhangs, which begin to close the openings of the trenches 304.

Figure 5A:
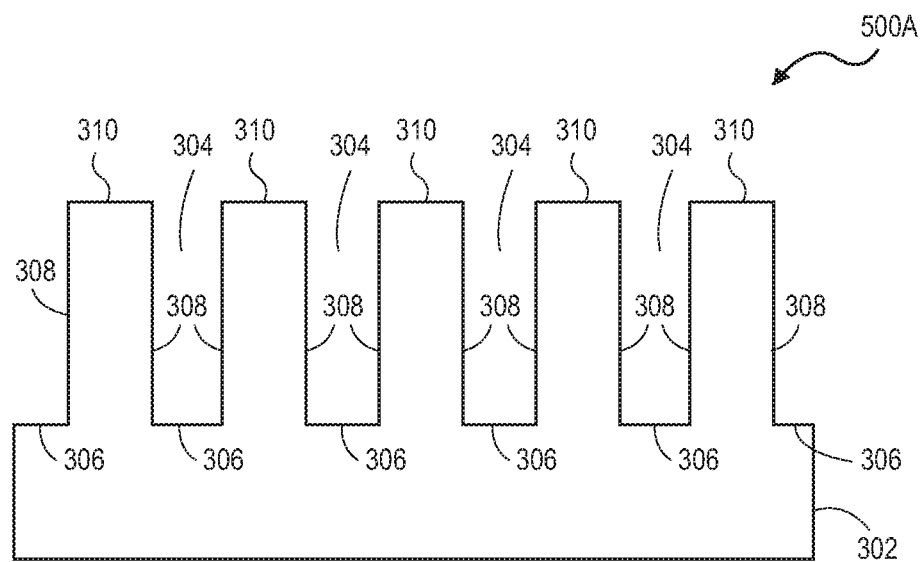
FIGS. 5A, 5B, 5C, 5D, 5E, and 5F illustrate cross-sectional views of a semiconductor wafer including a trench during performance of a gap fill method corresponding to operations in the flowchart of FIG. 4, in accordance with embodiments of the present invention.
Figure 5B:
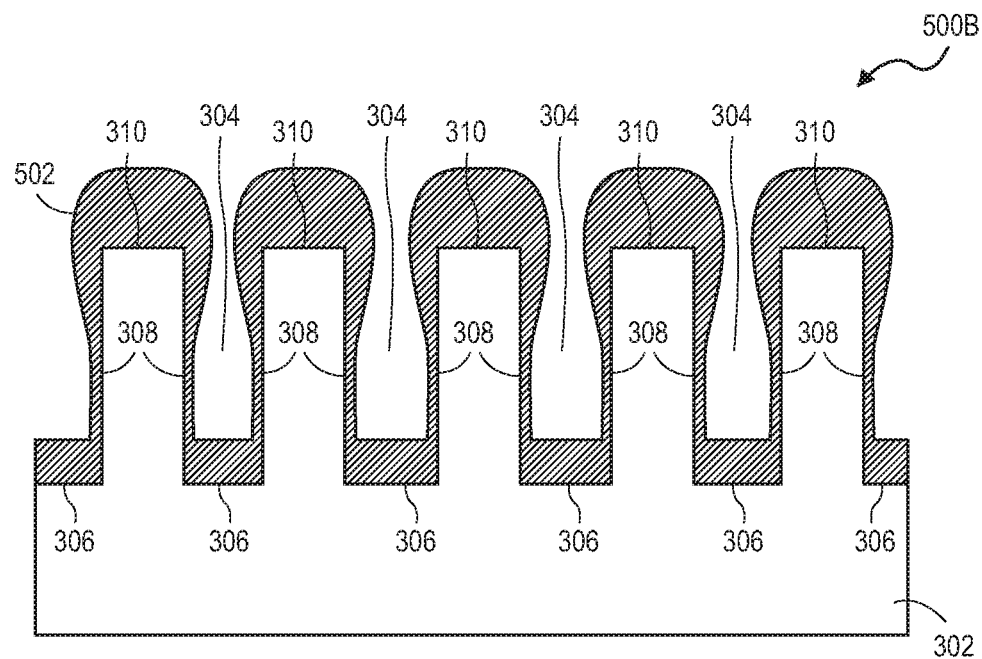
Figure 5C:
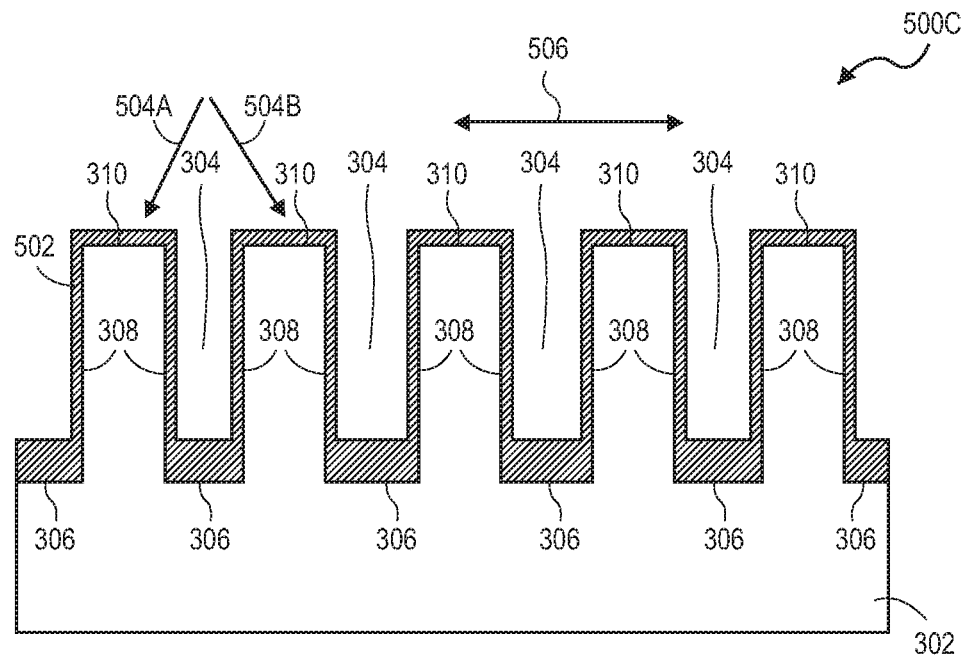

After deposition of the material in operation 402, an ion beam generation apparatus etches the layer 502 on the sidewalls with one or more angled ion beams at operation 404, as illustrated in the cross-sectional view 500C of FIG. 5C. In one embodiment, directing the angled ion beams 504A and 504B to the wafer surface results in directional sputtering or directional reactive ion etching of the deposited material. Unlike in existing gap fill methods, the ion beams 504A and 504B are at an angle with respect to the sidewalls 308, resulting in etching the layer 502 on the sidewalls 308 and the top surfaces 310, without significantly etching the deposited material at the trench bottoms 306. Thus, the angled ion beams 504A and 504B sputter the overhangs formed on the upper trench sidewalls, re-opening the tops of the trenches 304. Although two ion beams 504A and 504B are illustrated in FIG. 5C, other embodiments may employ one angled ion beam or more than two angled ion beams.

The ion beam angle refers to a center angle in an ion angular distribution, such as the distribution illustrated in the graph 900A of FIG. 9A. In embodiments, the ion beam angle with respect to the sidewalls 308 is the range of 1 to 85 degrees. According to one embodiment, etching the layer of material with the angled ion beams 504A and 504B includes moving the semiconductor wafer 302 and the ion beam sources relative to each other, as illustrated by the arrow 506. For example, in one embodiment, a scanning system includes a moving stage to support and move the semiconductor wafer 302 to expose different trenches 304 and top surfaces 310 to the ion beams 504A and 504B.

Figure 5D:
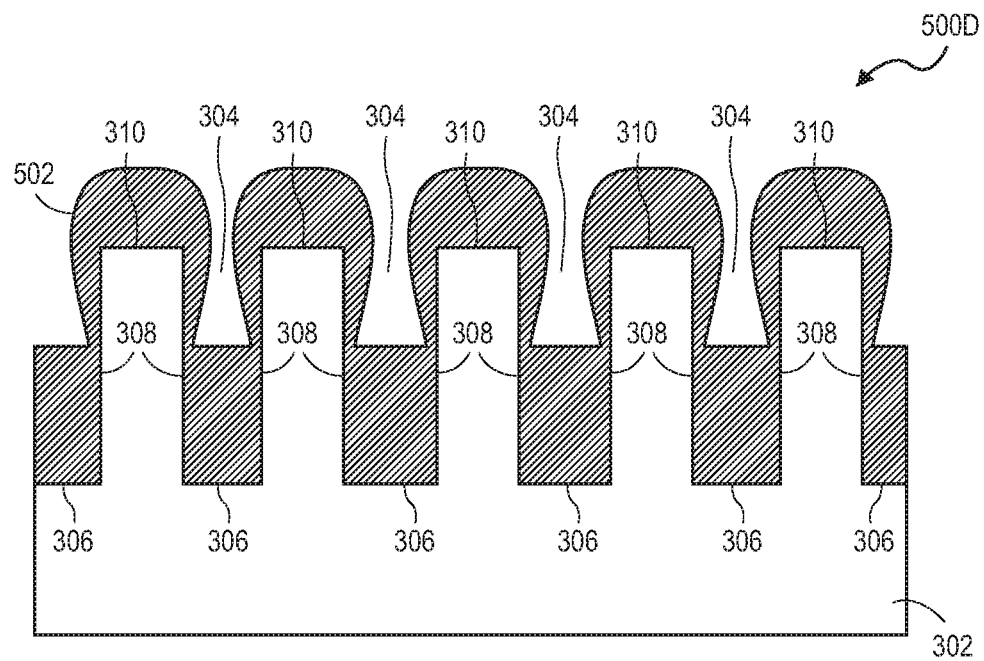
Figure 5E:
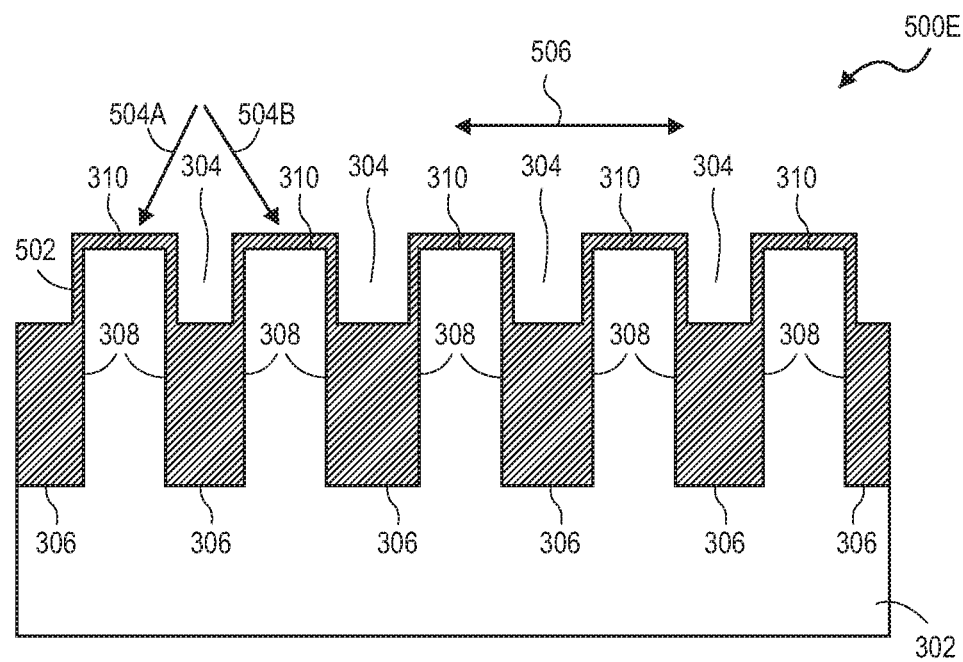
Figure 5F:
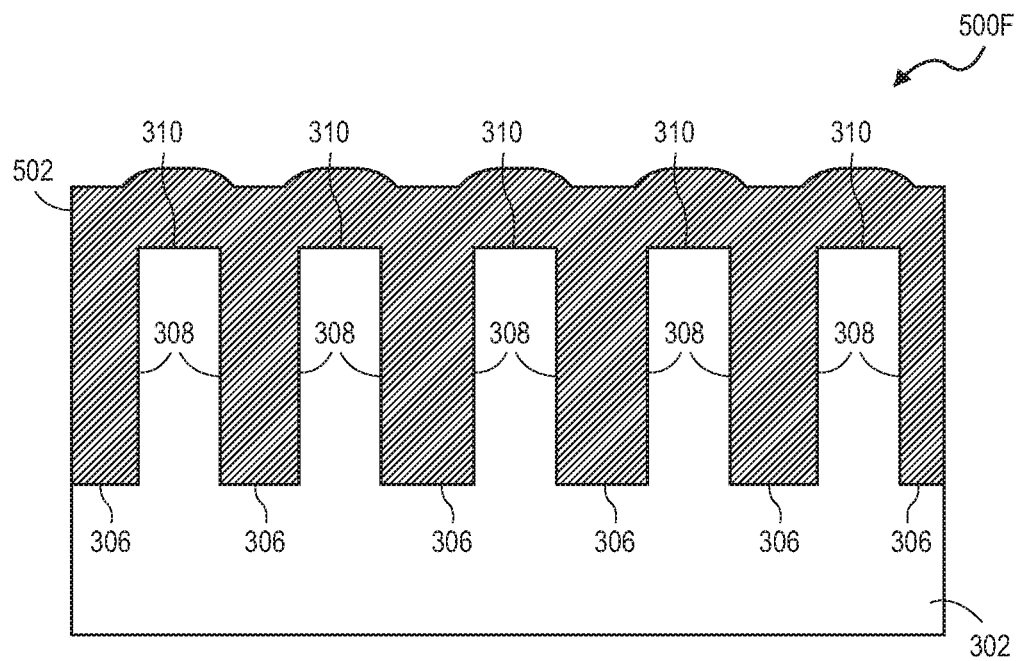

As mentioned above, the gap fill method 400 may involve multiple iterations of deposition and angled ion-beam etching. In one embodiment, a gap fill system performs four or more cycles of operations 402 and 404. Thus, at operation 406, a gap fill system controller determines whether the desired number of cycles of the operations 402 and 404 have been completed. If processing is complete, the method 400 terminates. If additional cycles are to be performed, the method involves repeating operations 402 and 404. FIGS. 5D-5F illustrate additional cycles of operations 402 and 404. FIG. 5D illustrates a cross-sectional view 500D of the trenches the semiconductor wafer 302 after a second deposition operation, resulting in further filling of the trench bottoms 306 and a thicker layer 502 of the material on the trench sidewalls 308 and the top surfaces 310. FIG. 5E illustrates a cross-sectional view 500E after a second angled ion beam etch operation, to etch the material on the upper sidewalls and top surfaces 310, without significantly etching the deposited material in the bottoms 306 of the trenches 304. FIG. 5F illustrates a cross-sectional view 500F after a third deposition operation, resulting in completion of filling of the trenches 304. As illustrated in FIGS. 5A-5F, the method 400 can achieve a bottom-up gap fill process for narrow trenches without forming voids.

In another embodiment, a method of gap fill can combine the method 200 of FIG. 2 and method 400 of FIG. 4, to include first treating a portion of the trench sidewalls 308 with an angled ion beam, followed by iterations of deposition and etching with an angled ion beam. One such embodiment can enable bottom-up gap fill with less sidewall treatment and/or fewer iterations of the deposition and etching operations described in method 400 of FIG. 4. For example, one embodiment can include directional plasma treatment as described in the method 200 to change the surface properties of the upper sidewalls to slightly slow the deposition rate on the treated portions, but not slow the deposition rate enough to completely prevent void formation in the trench. Such an exemplary method could then proceed with one or more cycles of deposition and directional etching as described in method 400 of FIG. 4.

Figure 6:
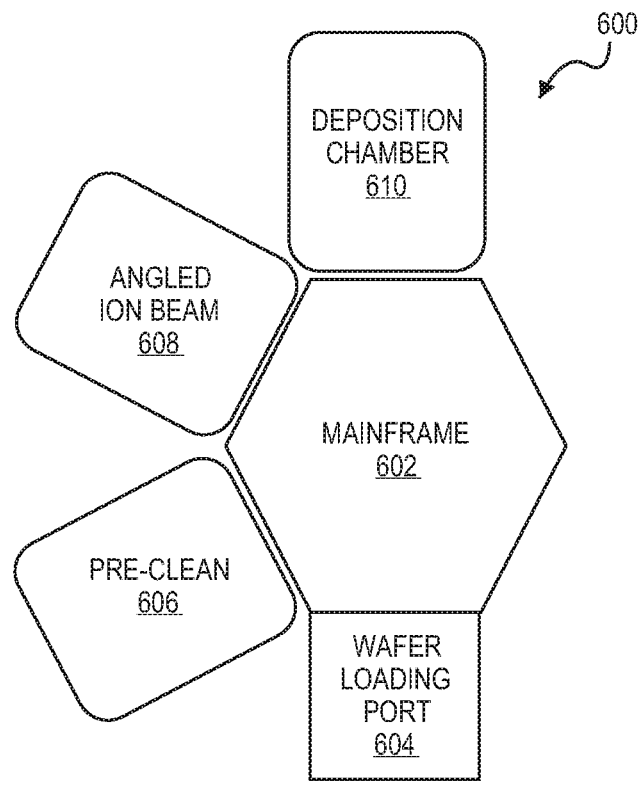
FIG. 6 illustrates a plan view schematic of an integrated system in a cluster configuration to fill trenches in a semiconductor wafer, in accordance with an embodiment of the present invention.
Figure 7:
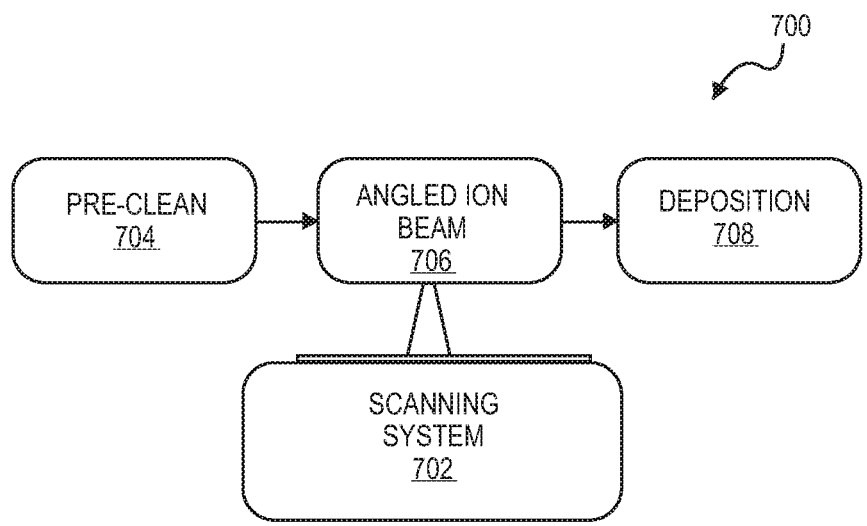
FIG. 7 illustrates a plan view schematic of an integrated system in a linear configuration to fill trenches in a semiconductor wafer, in accordance with an embodiment of the present invention.

FIGS. 6 and 7 illustrate exemplary systems for performing gap fill in accordance with embodiments described above. FIG. 6 illustrates a plan view schematic of an integrated system in a cluster configuration, in accordance with an embodiment of the present invention. The illustrated cluster configuration of the system 600 includes a centrally located mainframe 602 connected to a wafer loading port 604 to load semiconductor wafers or substrates into the system, and processing chambers 606, 608, and 610 for performing various processing operations. The mainframe includes a robotic mechanism for transferring semiconductor wafers or substrates amongst the wafer loading port 604 and the processing chambers 606, 608, and 610.

The system 600 includes a pre-cleaning chamber 606 for cleaning and preparing a wafer or substrate prior to processing in the chambers 608 and 610. The angled ion beam chamber 608 can include any apparatus that can generate angled ion beams. FIG. 8 illustrates one such example of a plasma generation apparatus capable of generating angled ion beams, and is described below in more detail. However, other systems capable of generating angled ion beams, such as beamline implantation systems, may also be used. The angled ion beam chamber 608 can be a low or high energy system operating in ranges from, for example, 50 eV to 50 keV, with a variety of dosage and implantation depth capabilities. In one embodiment, the angled ion beam chamber 608 generates angled ion beams for treating trench sidewalls, as described above with respect to the method 200 of FIG. 2. In one embodiment, the angled ion beam chamber 608 generates angled ion beams for performing directional etching of material deposited on sidewalls, as described above with respect to the method 400 of FIG. 4.

The system 600 also includes a deposition chamber 610. The deposition chamber can be any chemical vapor deposition (CVD) chamber, atomic layer deposition (ALD) chamber, plasma-enhanced chemical vapor deposition (PECVD), physical vapor deposition (PVD) chamber, or any other appropriate deposition chamber. Other systems may include other or different processing chambers.

FIG. 7 illustrates a plan view schematic of an integrated system in a linear configuration to fill trenches in a semiconductor wafer, in accordance with an embodiment of the present invention. The linear configuration of the system 700 includes a scanning system 702, which is capable of moving between processing stations 704, 706, 708. Although arrows indicate movement from a pre-clean station 704 to an angled ion beam station 706, and finally to a deposition station 708, in one embodiment, the scanning system can also move a semiconductor wafer back and forth between the angled ion beam station 706 and the deposition station 708. For example, the linear configuration illustrated in FIG. 7 may be employed for a gap fill method including multiple cycles of material deposition and angled ion beam etching, such as the method described in FIG. 4. In one such embodiment, the scanning system moves the semiconductor wafer or substrate being processed back and forth between the angled ion beam station 706 and the deposition station 708 until the gap fill process is complete.

FIG. 8 illustrates an exemplary directional plasma treatment system to generate angled ion beams used in methods of gap fill, in accordance with an embodiment of the present invention. The system 800 includes a processing chamber 802, which may be a vacuum chamber according to one embodiment. The system 800 includes a stage 804 for supporting a semiconductor wafer 801 or substrate for processing. The system 800 includes a scanning system to move the stage 804, and therefore move the semiconductor wafer 801 supported over the stage 804, with respect to an ion beam source that generates one or more angled ion beams 807. The arrows 806 illustrate one possible axis along which the system 800 can move the stage. The stage may also move in other directions, such as along an axis normal to the page (i.e., along an axis coming out of the page), in other directions in the plane defined by the arrows 806 and the surface normal to the page, and/or towards or away from the ion beam source.

In one embodiment, the stage rotates. Stage rotation may enable striking multiple faces of trench sidewalls with the ion beams 807. For example, in one embodiment with a single angled ion beam, a method includes rotating the stage 804 180 degrees at each treatment operation. In one such example, the ion beam treats one face of the trench sidewalls, the system 800 rotates the stage 804 180 degrees, and the ion beam treats the opposite face of the trench sidewalls. Thus, in one such embodiment, the system 800 treats the entire circumference or perimeter of the sidewalls with two treatments and one rotation of the stage 804. In other embodiments, two directional plasma treatments may be insufficient to treat the entire trench sidewall circumference or perimeter. In one such embodiment, the system rotates the stage 804 more than once and performs more than two directional plasma treatments. For example, in one embodiment, the system 800 rotates the stage 804 0, 45, 90, 135, 180, 225, 270, and 315 degrees. After each rotation, the system 800 can treat a portion of the sidewall surface. In other embodiments, the entire sidewall circumference can be treated without stage rotation. For example, in an embodiment with two ion beams 807 which are capable of treating the entire circumference or perimeter, the entire circumference can be treated without stage rotation. In yet other embodiments, the entire circumference or perimeter is not treated. For example, half of the circumference or perimeter of the sidewalls is treated, and the remaining half is left untreated. After directional plasma treatment and/or stage rotation to treat one or more trenches, the system 800 can then move the stage (e.g., in one of the directions indicated by the arrows 806) to treat neighboring trench(es). The system 800 can perform several cycles of rotating and/or moving of the stage to treat trenches across the semiconductor wafer or substrate.

Gas injected into the system 800 enters through a top 808 of the chamber 802, and may be deflected by a gas baffle 810. A valve 803 (e.g., a pendulum valve) and a pump 805 (e.g., turbo pump) control pressure in the chamber 802. One embodiment further includes a pump in the ion source for pressure control between the source and the chamber 802. An RF source 812 supplies RF power to either one or both of planar antenna 820 and the helical antenna 814 to generate the plasma. A bias power supply 816 may provide a pulsed signal (e.g., in the range of 50-20,000 V) connected to the stage, and having pulsed ON and OFF periods to bias the stage 804 and hence the semiconductor wafer 801 to accelerate ions from the plasma towards the semiconductor wafer 801. The illustrated system 800 also includes one or more plasma sheath modifiers 822 that can be insulators, semiconductors, or conductors. The plasma sheath modifiers 822 control the angles at which the ion beams 807 are emitted. Thus, the angled ion beams 807 may be employed in performing one or more gap fill embodiments described above.

Figure 10:
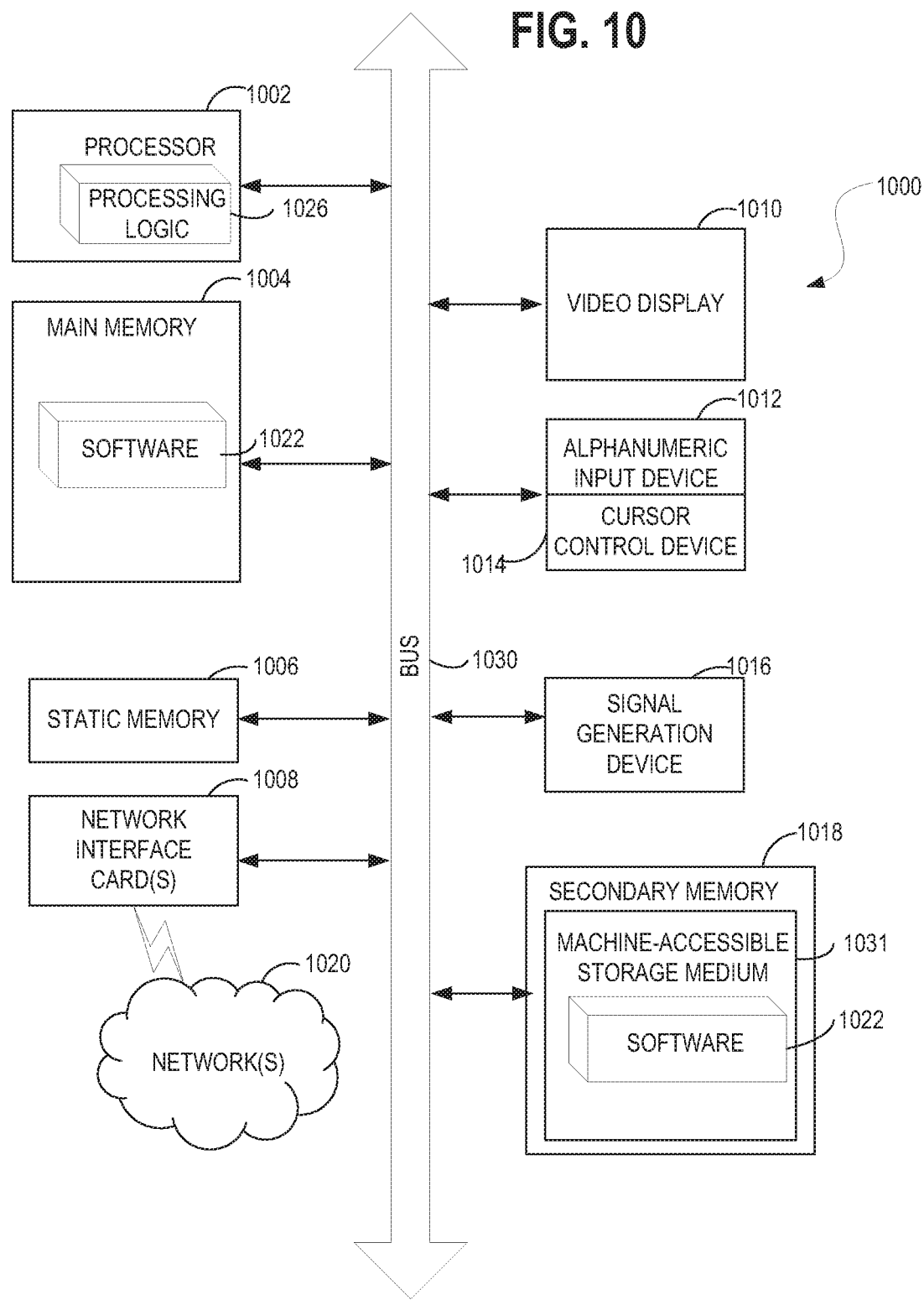
FIG. 10 illustrates a block diagram of an exemplary computer system which controls automated performance of one or more operation in the methods described herein, in accordance with an embodiment of the present invention.

FIG. 10 illustrates a computer system 1000 within which a set of instructions, for causing the machine to execute one or more of the scribing methods discussed herein may be executed. The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, etc. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations and steps discussed herein.

The computer system 1000 may further include a network interface device 1008. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1031 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, optical and magnetic media, and other non-transitory machine-readable storage medium.

Thus, the above description describes a method and system for three dimensional structure fill. It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of filling a trench in a semiconductor wafer, the method comprising:
    depositing a material on the semiconductor wafer, filling a bottom of the trench and forming a layer on a sidewall of the trench and a top surface adjacent to the trench; and
    etching the layer on the sidewall of the trench and the top surface with an ion beam at an angle with respect to the sidewall, wherein the etching does not entirely remove the layer from the sidewall and top surface of the trench and leaves a first portion of the layer remaining on the top surface of the trench and leaves a second portion of the layer remaining on the sidewall of the trench, the second portion continuous with the first portion.

2. The method of claim 1, further comprising multiple iterations of depositing the material on the semiconductor wafer, and etching the layer on the sidewall of the trench and the top surface with the ion beam at the angle with respect to the sidewall.

3. The method of claim 1, wherein etching the layer on the sidewall of the trench and the top surface comprises generating the ion beam at the angle in a range of 1 to 85 degrees with respect to the sidewall.

4. The method of claim 1, wherein the trench has an aspect ratio of approximately 5 to 1, and wherein etching the layer on the sidewall of the trench and the top surface comprises generating the ion beam at the angle in a range of 1 to 20 degrees with respect to the sidewall.

5. The method of claim 1, wherein the trench has an aspect ratio of approximately 5 to 1, and wherein etching the layer on the sidewall of the trench and the top surface comprises etching the layer on a top 20-30% of the sidewall.

6. The method of claim 1, wherein depositing the material on the semiconductor wafer comprises filling a bottom of the trench with a dielectric or metal via chemical vapor deposition (CVD), physical vapor deposition (PVD), plasma-enhanced chemical vapor deposition (PECVD), or atomic layer deposition (ALD).

* * * * *